(12) United States Patent
Terakura et al.

(10) Patent No.: US 10,157,750 B2
(45) Date of Patent: Dec. 18, 2018

(54) PLASMA PROCESSING METHOD AND PLASMA PROCESSING APPARATUS

(71) Applicant: HITACHI HIGH-TECHNOLOGIES CORPORATION, Minato-ku, Tokyo (JP)

(72) Inventors: Satoshi Terakura, Tokyo (JP); Masahito Mori, Tokyo (JP); Takao Arase, Tokyo (JP); Taku Iwase, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/558,045

(22) PCT Filed: Jan. 31, 2017

(86) PCT No.: PCT/JP2017/003258
§ 371 (c)(1),
(2) Date: Sep. 13, 2017

(87) PCT Pub. No.: WO2017/154407
PCT Pub. Date: Sep. 14, 2017

(65) Prior Publication Data
US 2018/0068862 A1    Mar. 8, 2018

(30) Foreign Application Priority Data
Mar. 28, 2016    (JP) .................. 2016-062977

(51) Int. Cl.
*H01L 21/3065*    (2006.01)
*H05H 1/46*    (2006.01)
(Continued)

(52) U.S. Cl.
CPC ...... *H01L 21/3065* (2013.01); *H01J 37/3244* (2013.01); *H01J 37/32082* (2013.01);
(Continued)

(58) Field of Classification Search
CPC .................................................. H01L 21/3065
(Continued)

(56) References Cited

U.S. PATENT DOCUMENTS

2010/0330805 A1    12/2010  Doan et al.
2011/0253672 A1    10/2011  Kamibayashi et al.
(Continued)

FOREIGN PATENT DOCUMENTS

JP    2009-135478 A    6/2009
JP    2011-228436 A    11/2011
(Continued)

OTHER PUBLICATIONS

Korean Office Action dated Aug. 27, 2018 for Application No. 10-2017-7020315 with Machine translation.
(Continued)

*Primary Examiner* — Roberts P Culbert
(74) *Attorney, Agent, or Firm* — Miles & Stockbridge P.C.

(57) ABSTRACT

The present invention provides a plasma processing method and a plasma processing apparatus. The plasma processing method enables consistent processing by realizing a high selectivity and a high etching rate when etching a laminated film using a boron-containing amorphous carbon film, realizes high throughput including prior and post processes by simplifying a mask forming process, and has shape controllability of vertical processing. In the present invention, in a plasma processing method for forming a mask by plasma-etching a laminated film including an amorphous carbon film containing boron, the boron-containing amorphous carbon film is plasma-etched by using a mixed gas of an oxygen gas, a fluorine-containing gas, a halogen gas, and a silicon
(Continued)

tetrafluoride gas, or a mixed gas of an oxygen gas, a fluorine-containing gas, a halogen gas, and a silicon tetrachloride gas.

7 Claims, 4 Drawing Sheets

(51) Int. Cl.
- *H01L 21/02* (2006.01)
- *H01L 21/027* (2006.01)
- *H01J 37/32* (2006.01)
- *H01L 21/311* (2006.01)

(52) U.S. Cl.
CPC ...... *H01L 21/0212* (2013.01); *H01L 21/0214* (2013.01); *H01L 21/0276* (2013.01); *H01L 21/02129* (2013.01); *H01L 21/31122* (2013.01); *H01L 21/31144* (2013.01); *H05H 1/46* (2013.01); *H05H 2001/469* (2013.01)

(58) Field of Classification Search
USPC .......................................................... 438/711
See application file for complete search history.

(56) References Cited

U.S. PATENT DOCUMENTS

| | | |
|---|---|---|
| 2015/0064914 A1 | 3/2015 | Kong et al. |
| 2015/0099366 A1 | 4/2015 | Takeda et al. |
| 2015/0221518 A1 | 8/2015 | Terakura et al. |
| 2016/0005602 A1 | 1/2016 | Yoo et al. |

FOREIGN PATENT DOCUMENTS

| | | |
|---|---|---|
| JP | 2014-007370 A | 1/2014 |
| JP | 2015-144158 A | 8/2015 |

OTHER PUBLICATIONS

Korean Office Action dated Aug. 30, 2018 for Application No. 10-2018-7015807 with Machine translation.

PLASMA PROCESSING METHOD AND PLASMA PROCESSING APPARATUS

TECHNICAL FIELD

The present invention relates to a plasma processing method and a plasma processing apparatus for processing a sample by using plasma related to semiconductor manufacturing.

BACKGROUND ART

In a gate manufacturing process of a flash memory (such as 3D-NAND) having a three-dimensional structure, as disclosed in PTL 1, along with the increase in device capacity, the total number of pair layers of a polysilicon film and a silicon oxide film is increasing to 48 layers, 72 layers, 96 layers, and 120 layers, and a high aspect ratio plasma etching processing is progressing.

Conventionally, when these laminated films are etched, a laminated film of a patterned photoresist film (PR), an antireflection film (bottom anti-reflection coat (BARC)), and an amorphous carbon film (amorphous carbon layer (ACL), hereinafter called an ACL film) has been used as an etching mask. However, with the increase in the aspect ratio, the thickness shortage of a mask of the amorphous carbon film becomes obvious.

Therefore, a B-doped ACL film is applied in which an ACL film is doped with (contains) boron element (B), and boron improved in plasma resistance is contained. When a conventional ACL film is etched, a resist pattern is transferred to an ACL film by adding COS or nitrogen by using oxygen as a main component or by using plasma diluted with argon or helium. However, it has been difficult to etch a 10 to 40% boron-containing B-doped ACL film in this gas system.

To solve this problem, PTL 2 discloses a method for performing etching by increasing volatility of a reaction product of boron by setting the temperature of a wafer stage to 100° C. or higher, and PTL 3 discloses a method for etching at room temperature of 10 to 30° C. by converting to boron fluoride by using a mixed gas of $CH_4$, $Cl_2$, $SF_6$, and $O_2$, by increasing the volatility of the reaction product, and by controlling process perpendicularity by $Cl_2$ and $CH_4$.

CITATION LIST

Patent Literature

PTL 1: JP 2015-144158 A
PTL 2: JP 2014-007370 A
PTL 3: US 2015/0064914 A1

SUMMARY OF INVENTION

Technical Problem

In the method disclosed in PTL 2, when a sample having a mask structure of PR/BARC/SiON/B-doped ACL is etched, since the temperature of a photoresist film is high, a pattern is damaged due to carbonization. Further, when a pair layer of silicon/silicon oxide films which is a lower layer is etched, it is necessary to etch the layer at a low temperature side of 50° C. or less. Therefore, it is not possible to etch from a mask to an underlying film in the same chamber (so-called consistent processing). Even if the consistent processing can be carried out, there is a problem that a temperature waiting time is long, and throughput of the etching process is lowered.

Further, according to the method disclosed in PTL 3, since the selectivity of a silicon oxynitride film is low in comparison with conventional etching of an ACL film. Therefore, in the case where a silicon oxynitride film having a thickness of 30 to 40 nm required to etch a conventional ACL film is used, etching does not reach a $SiO_2$ film which is a lower layer, or a faceting phenomenon occurs which causes retreating from an opening of the silicon oxynitride film while etching.

To avoid these problems, it is necessary to use a method for thickening the silicon oxynitride film. However, there is a problem that throughput in a mask forming process is significantly reduced, and consequently cost of ownership (CoO) significantly increases.

Furthermore, a boron concentration and the center value of a stage temperature to be used may be appropriately changed depending on combination with upper and lower layer films. Therefore, in the case of etching a B-doped ACL film, it is necessary to have shape controllability which can eliminate other shape abnormality (side etching, bowing, etching stop) and realize etching processing close to vertical.

As describe the above, an object of the present invention is to provide a plasma processing method and a plasma processing apparatus. The plasma processing method enables consistent processing by realizing a high selectivity and a high etching rate in the case of etching a laminated film using a boron-containing amorphous carbon film, realizes high throughput including prior and post processes by simplifying a mask forming process, and has shape controllability in vertical processing.

Solution to Problem

In the present invention, in a plasma processing method for forming a mask by plasma-etching a laminated film including an amorphous carbon film containing boron, the boron-containing amorphous carbon film is plasma-etched by using a mixed gas of an oxygen gas, a fluorine-containing gas, a halogen gas, and a silicon tetrafluoride gas, or a mixed gas of an oxygen gas, a fluorine-containing gas, a halogen gas, and a silicon tetrachloride gas.

Further, in the present invention, a plasma processing apparatus includes a processing chamber and a radio frequency power supply. In the processing chamber, a sample is plasma-processed. The radio frequency power supply supplies a radio frequency power for generating plasma in the processing chamber. The plasma processing apparatus further includes a gas supply mechanism for supplying a first gas and a second gas to be mixed with the first gas into the processing chamber via a plurality of regions.

Advantageous Effects of Invention

According to the present invention, it is possible to etch an amorphous carbon film containing boron by using an inorganic film as a mask at a high etching rate and high selectivity.

DESCRIPTION OF EMBODIMENTS

Figure 1:
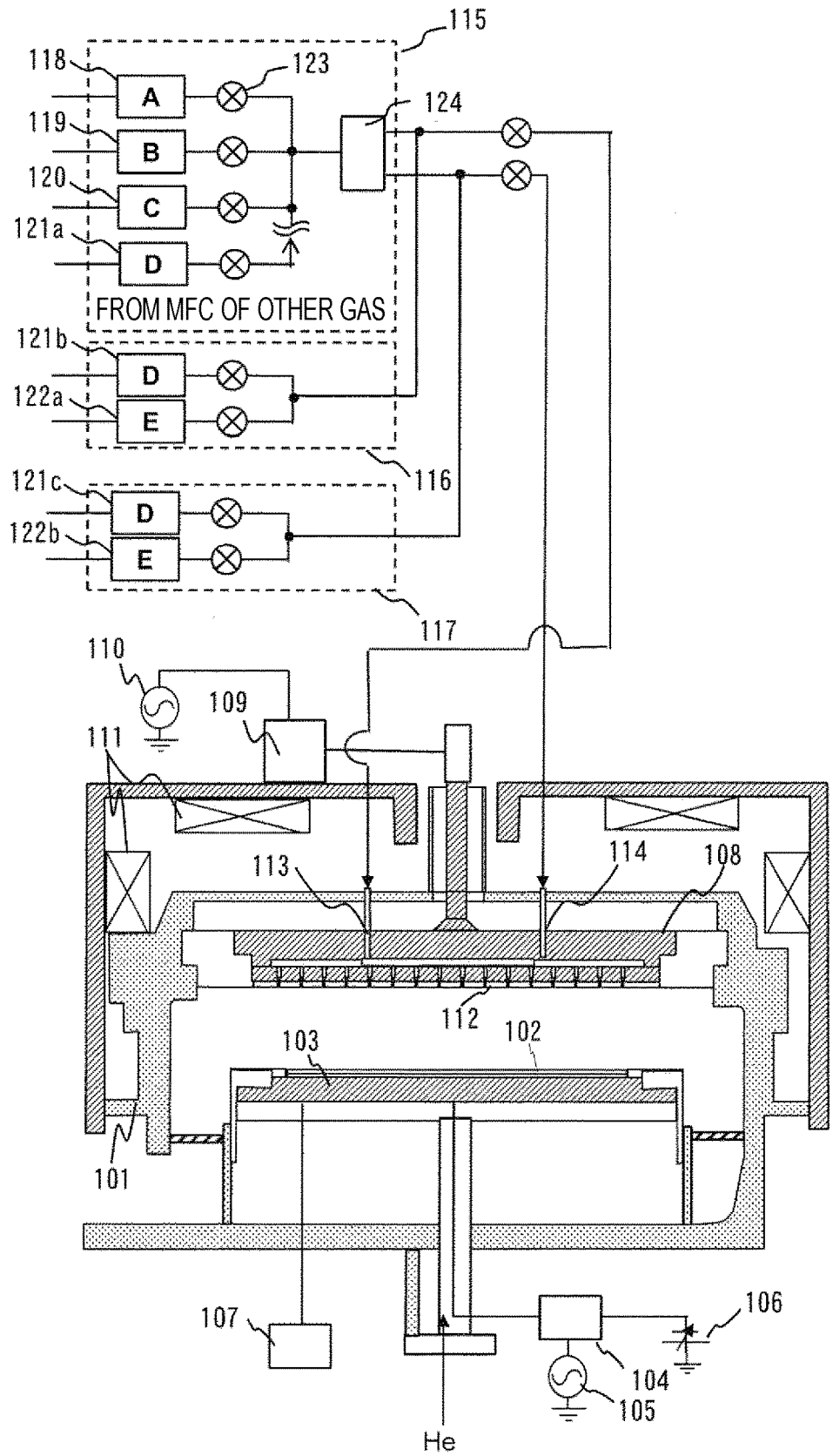
FIG. 1 is a longitudinal sectional view of a parallel flat plate-type magnetic field VHF dry etching apparatus according to the present invention.

An embodiment of the present invention will be described with reference to FIGS. 1 to 5. FIG. 1 is a longitudinal sectional view of a parallel flat plate-type magnetic field VHF dry etching apparatus which is an example of the plasma processing apparatus according to the present invention.

A sample stand 103 on which a wafer 102 as a sample is placed is provided on a lower portion in a vacuum vessel 101 which is a processing chamber and has a cylindrical inner space. A radio frequency power supply 105 for bias application and a DC power supply 106 for wafer electrostatic attraction are connected to the sample stand 103 via a first matching unit 104. Further, a temperature control unit 107 is connected to the sample stand 103. In this case, the radio frequency power supply 105 uses a frequency of 4 MHz.

An exhaust port is provided in a lower portion of the vacuum vessel 101, and an exhaust device (not illustrated) is connected to the exhaust port. A flat plate-like antenna 108 is provided at an upper portion in the vacuum vessel 101 so as to face a wafer placing surface of the sample stand 103, and a radio frequency power supply 110 for plasma generation is connected via a second matching unit 109. In the embodiment, the radio frequency power supply 110 uses a VHF wave having a frequency of 200 MHz. A solenoid coil 111 for forming a magnetic field in the vacuum vessel 101 is provided on an upper surface and an outer periphery of the outside of the vacuum vessel 1. The solenoid coil 111 forms a diverging magnetic field toward the sample stand 103 in an axial direction of the vacuum vessel 101.

A shower plate 112 having a number of gas supply holes is provided on a lower surface of the antenna 108 opposed to the sample stand 103, and an inner space and an outer space surrounding the inner space are formed between the antenna 108 and the shower plate 112, and the gas supply hole is connected to each of the spaces. An inner gas supply channel 113 is provided in the inner space, and an outer gas supply channel 114 is provided in the outer space. A main gas system 115 and the inner added gas system 116 are mixed and connected to the inner gas supply channel 113, and the main gas system 115 and an outer added gas system 117 are mixed and connected to the outer gas supply channel 114.

The main gas system 115 is a gas system of a first gas which is a mixed gas including oxygen, a fluorine-containing gas, a halogen gas, and an inert gas. In this embodiment, the fluorine-containing gas is $CHF_3$, the halogen gas is $Cl_2$, and the inert gas is $N_2$. The main gas system 115 includes a flow rate controller A118, a flow rate controller B119, a flow rate controller C120, a flow rate controller D121a, a stop valve 123, and a gas flow divider 124. The flow rate controller A118 controls a flow rate of the gas source $O_2$. The flow rate controller B119 controls a flow rate of the gas source $CHF_3$. The flow rate controller C120 controls a flow rate of the gas source $Cl_2$. The flow rate controller D121a controls a flow rate of the gas source $N_2$. The stop valve 123 is connected to each of the flow rate controllers 118 to 121a. The gas flow divider 124 supplies a gas mixed through each stop valve 123.

The inner added gas system 116 and the outer added gas system 117 are gas systems of the second gas which is a mixed gas including a silicon-containing gas (silicon tetrachloride gas or silicon tetrafluoride gas) and an inert gas. In the embodiment, the silicon-containing gas is $SiCl_4$, and the inert gas is $N_2$. The inner added gas system 116 includes a flow rate controller D121b, a flow rate controller E122a, and the stop valve 123. The flow rate controller D121b controls a flow rate of the gas source $N_2$. The flow rate controller E122a controls a flow rate of the gas source $SiCl_4$. The stop valve 123 is connected to each of the flow rate controllers 121b and 122a. The inner added gas system 116 supplies a gas mixed through each of the stop valves 123. The outer added gas system 117 includes a flow rate controller D121c, a flow rate controller E122b, and the stop valve 123. The flow rate controller D121c controls a flow rate of the gas source $N_2$. The flow rate controller E122b controls a flow rate of the gas source $SiCl_4$. The stop valve 123 is connected to each of the flow rate controllers D121c and 122b. The outer added gas system 117 supplies a gas mixed through each of the stop valves 123.

Each gas whose gas flow rate from each gas source is adjusted to a set flow rate by the flow rate controllers 118 to 121a is divided by the gas flow divider 115 at a predetermined ratio into the inner gas supply channel 113 and the outer gas supply channel 114 and caused to flow. Each gas whose gas flow rate from each gas source is adjusted to a set flow rate by the flow rate controllers 121b and 122a is mixed with the gas divided by the gas flow divider 115 into the inner gas supply channel 113, supplied to an inner space of the shower plate 112, and supplied to the center side of the vacuum vessel 101 via a gas supply hole.

Each gas whose gas flow rate from each gas source is adjusted to a set flow rate by the flow rate controllers 121c and 122b is mixed with the gas divided by the gas flow divider 115 into the outer gas supply channel 114, supplied to an outer space of the shower plate 112, and supplied to the outer side surrounding the center portion of the vacuum vessel 101 via the gas supply hole.

That is, the main gas is divided by the gas flow divider 124 in accordance with the divided inner and outer regions of the shower plate at a predetermined ratio, and the added gas whose flow rate has been adjusted is merged with each main gas divided at a predetermined ratio and supplied to the inner and outer regions of the shower plate. As a result, it is possible to obtain an in-plane distribution in which each gas component is arbitrarily adjusted in a radial direction below the shower plate 112 in the vacuum vessel 101.

In the embodiment, a gas storage space in the shower plate 112 is divided into two regions, inside and outside. However, it may be three or more regions, or the gas storage space may be divided into a plurality of regions in a circumferential direction. In accordance with the number of divided regions, the number of divisions of the gas flow divider 124 may be set, and the number of added gas systems of the same gas type may be set.

The effect of dividing gas regions becomes further effective as the distance between the shower plate 112 and the sample stand 103 becomes narrow.

Processing is performed as follows by the device configured as described above.

The wafer 102 carried into the vacuum vessel 101 by a conveying device (not illustrated) is placed on the sample stand 103, and the wafer 102 is electrostatically attracted onto the sample stand 103 by voltage application from the DC power supply 106. A heat transfer gas, $H_2$ gas, is supplied to a back surface of the wafer 102 sucked and held by the sample stand 103, heat is transferred to the sample stand 103 whose temperature is adjusted by the temperature control unit 107, and the wafer 102 is maintained at a predetermined processing temperature.

After holding the wafer 102 on the sample stand 103, in the vacuum vessel 101, a mixed gas of $O_2$, $CHF_3$, $Cl_2$, $SiCl_4$, and $N_2$ is supplied which are processing gases whose flow rates are controlled from the main gas system 115, the inner added gas system 116, and the outer added gas system 117 to the inner gas supply channel 113 and the outer gas supply channel 114. The supplied mixed gas is supplied into the vacuum vessel through the shower plate 112 and maintained at a predetermined processing pressure in the vacuum vessel 101, and the mixed gas is excited and converted into plasma by magnetic field action from the solenoid coil 111 with a radio frequency power of 200 MHz from the radio frequency power supply 110.

After the plasma is generated, a radio frequency power for bias is supplied to the sample stand 103 by the radio frequency power supply 105. As a result, ions in the plasma are incident on the wafer 2, and etching processing of the wafer 102 is performed. At this time, a component of each gas to be supplied into the vacuum vessel 101 is arbitrarily adjusted in a radial direction, radicals and ions of the gas component dissociated according to in-plane distribution are distributed in the plasma, and the wafer 102 is adjusted so as to uniformly act on in-plane etching processing.

Figure 2:
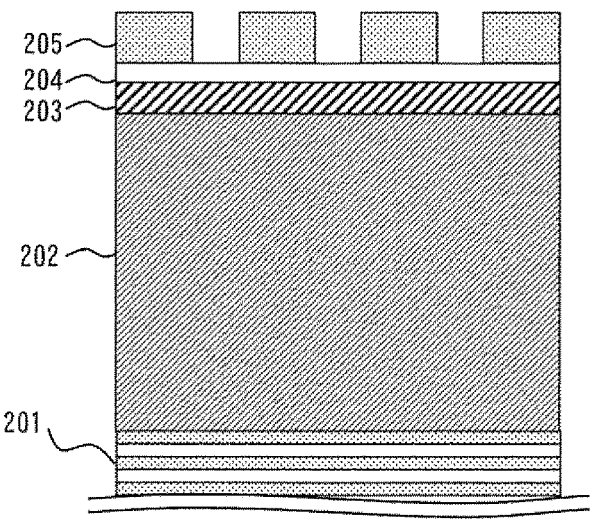
FIGS. 2(a) to 2(c) are views indicating an etching shape in one embodiment by a plasma processing method according to the present invention.
Figure 2:
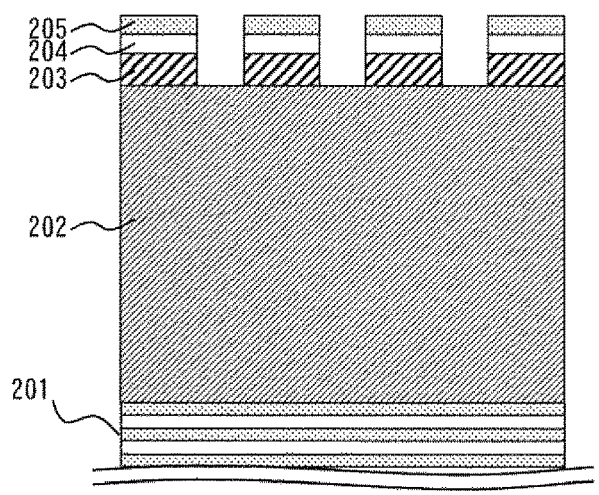
Figure 2:
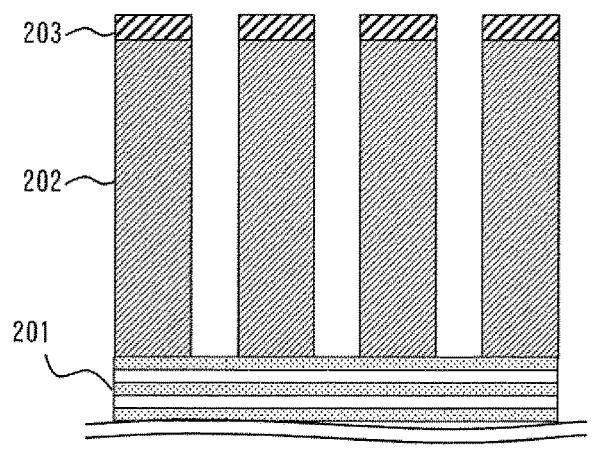
Figure 3:
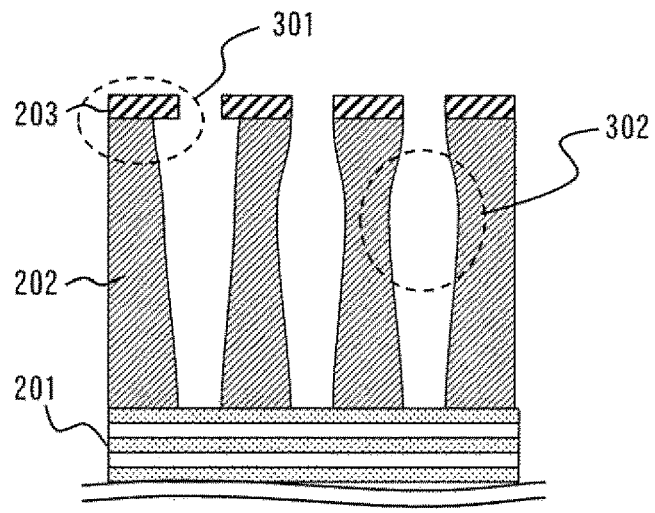
FIGS. 3(a) to 3(c) are schematic diagrams of an etching cross section indicating shape abnormality.
Figure 3:
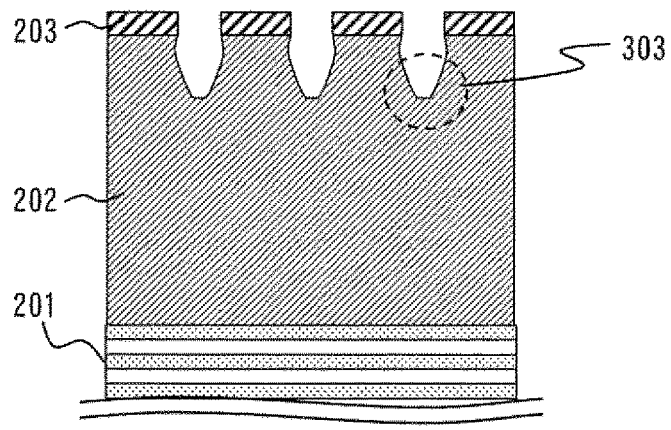
Figure 3:
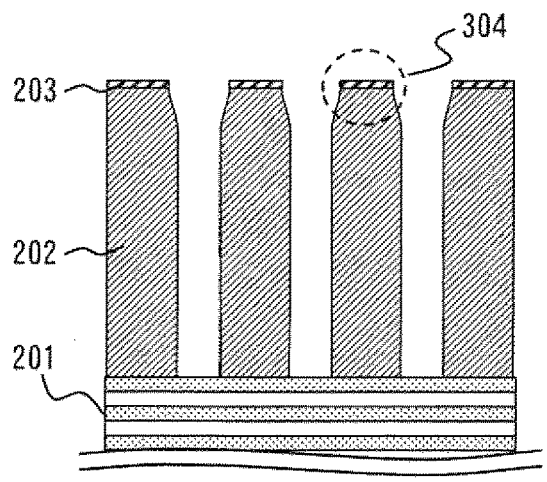

Here, the wafer 102 to be etched includes the laminated film indicated in FIG. 2 (a). A pair layer 201 and a laminated film in which a silicon oxide film (SiO2) and a polysilicon film (Poly-Si) are alternately laminated are provided on a wafer substrate in the embodiment. An ACL film (B-doped ACL film) 202, a silicon oxynitride film (SiON) 203, an antireflection film (BARC) 204, and a photoresist film (PR) 205 are sequentially provided on the pair layer 201.

Next, etching processing of the film having the above-described structure will be described. First, as indicated in FIG. 2 (b), a pattern is transferred by etching the antireflection film 204 and the silicon oxynitride film 203 by using, as a mask, the photoresist film 205 having an exposed circuit pattern. In this etching processing of the silicon oxynitride film 203, a mixed gas of $CHF_3$ gas and $SF_6$ gas is used. Further, at this time, a process for removing the photoresist film 205 and the antireflection film 204 may be performed. Subsequently, as indicated in FIG. 2(c), the B-doped ACL 202 is etched by using the silicon oxynitride film 203 as a mask.

In the present invention, to etch boron in the ACL film 202 by using the silicon oxynitride film 203 as a mask, in addition to oxygen which is a conventional ACL etchant, a mixed gas of a fluorine-containing gas, a halogen gas, a silicon tetrachloride gas ($SiCl_4$) or a silicon tetrafluoride gas ($SiF_4$) is used.

At this time, a ratio of the halogen gas with respect to the entire gas is appropriately set according to the content of boron (for example, 5 to 70%) contained in the B-doped ACL 202 and a set temperature of the temperature control unit 107. In the embodiment, in the case where the B-doped ACL film having a boron concentration of 55% is etched, a temperature of the temperature control unit 107 is set to 50° C., and a mixed gas of $O_2$ gas, $CHF_3$ gas, $Cl_2$ gas, and $SiCl_4$ gas is used. In this case, a trend of each gas type is as follows.

First, when the ratio of $CHF_3$ with respect to a flow rate of the entire gas is high, fluorine radicals is excessively supplied, and reaction with carbon as well as boron is promoted. Further, as indicated in FIG. 3(a), a side etch 301 and a bowing 302 occur on the B-doped ACL film 202. In addition, if the ratio of $CHF_3$ is low, the etching does not proceed, and an etch stop 303 is formed as indicated in FIG. 3(b). By appropriately controlling a gas ratio with $CHF_3$ by adding $Cl_2$, both of side-etch suppression and a high etching rate can be achieved at the same time.

Further, in general, it is preferable that the temperature of the sample stand 103 is set such that each temperature difference appropriate to etching from a film above the B-doped ACL film to a film below the B-doped ACL film is within ±10° C. (a temperature change waiting time is within 10 s when a change rate between steps is 1° C./s) to maintain a high throughput in the consistent processing from the film above the B-doped ACL film to the film below the B-doped ACL film. In addition, it is common to change the temperature of the sample stand 103 according to a material change of the layers above and below the B-doped ACL film.

Therefore, during the consistent processing from the film above the B-doped ACL film to the film below the B-doped ACL film, the temperature of the sample stand 103 is raised as needed, and the flow rate ratio of $CHF_3$ is decreased and increased for each film to maintain a high etching rate. Then, by controlling a $Cl_2$ gas ratio with respect to the $CHF_3$ gas, it is possible to achieve both of a high etching rate and perpendicularity at the same time. On the other hand, when the temperature of the sample stand 103 is decreased, a side etch can be reduced by decreasing a reaction probability of fluorine radicals due to the temperature decrease. Therefore, it is preferable to reduce the $Cl_2$ gas ratio with respect to the $CHF_3$ gas. That is, it is possible to adjust angles of a bowing shape and a taper shape by adjusting the temperature of the sample stand 103.

Figure 4:
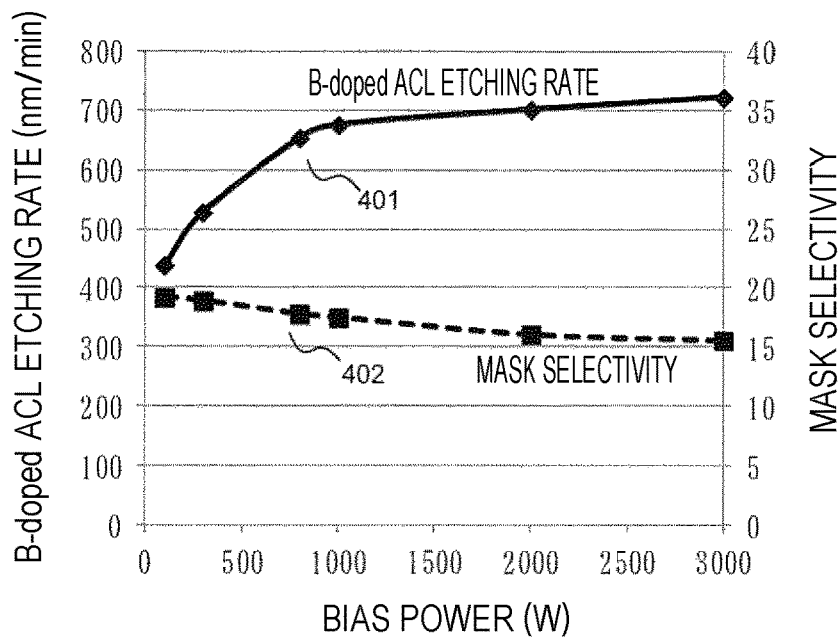
FIG. 4 is a diagram indicating bias power dependency with respect to a B-doped ACL etching rate and mask selectivity in the present invention.

By setting the $Cl_2$ gas ratio with respect to the $CHF_3$ gas to a high ratio, it is possible to obtain an anisotropic shape. However, by using a further high bias electric power and pressure region, it is possible to perform processing at a rate equal to or higher than that of conventional ACL etching. In addition, the high bias has an effect of increasing sidewall protection due to increase in reaction products and has the effect of suppressing side etching and a bowing shape. Furthermore, as illustrated in FIG. 4, an etching rate 401 of the B-doped ACL film significantly increases with increase in bias power in a region where the bias power is 1000 W or less, and the etching rate 401 gradually increases in a region where the bias power is 1000 W or more.

In addition, the mask selectivity 402 gradually decreases as bias power increases. However, the extent of decrease is small. That is, to process the B-doped ACL film at a high etching rate, it is preferable to set a power of the bias power supply to 1000 W or more. At this time, at 1000 W of 4 MHz, Vpp which is a peak-to-peak voltage of a sinusoidal wave is 1350 V. Therefore, when bias frequencies are different, the power can be adjusted by controlling the power supply power equal to or higher than Vpp or by directly controlling Vpp.

Figure 5:
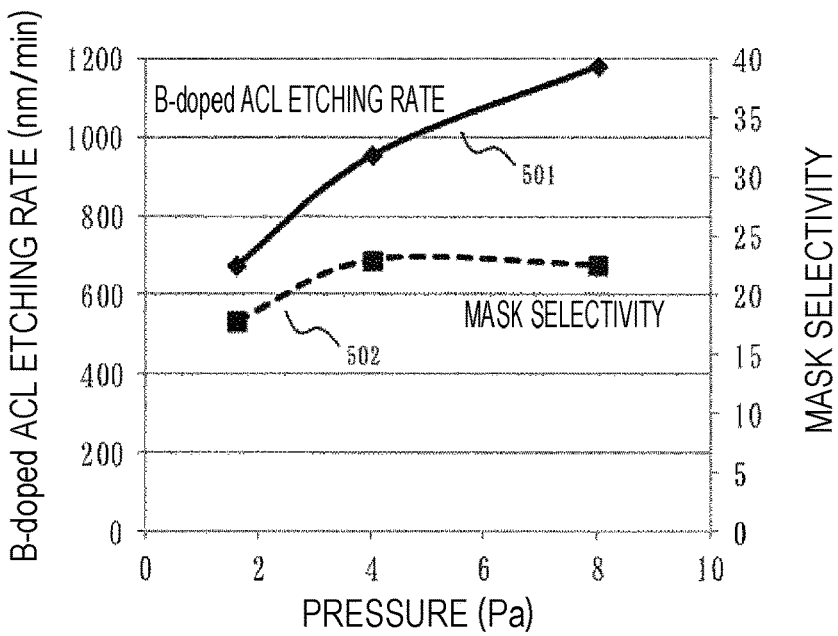
FIG. 5 is a diagram indicating pressure dependency with respect to the B-doped ACL etching rate and the mask selectivity in the present invention.

As the pressure is further increased, radical flux increases, and a plasma density decreases. Therefore, as indicated in FIG. 5, the etching rate 501 of the B-doped ACL film increases, and the selectivity also increases. Since selectivity 502 is saturated in a region where a pressure is 4 Pa or more, the pressure is preferably set to 4 Pa or more.

In the present invention, by adding silicon tetrachloride gas or silicon tetrafluoride gas, the silicon oxide compound is deposited on the silicon oxynitride film 203 which is a mask, the etching amount of the silicon oxynitride film 203 is reduced, and therefore the selectivity can be increased. Further, since the remaining amount of the mask increases, retraction of the mask can be reduced. As indicated in FIG. 3(c), it is possible to suppress a faceting 304 on the top of a shape and to set the mask film thickness to 30 to 40 nm as thick as the thickness in the conventional ACL etching processing. This makes it possible to avoid complication of the mask forming process and to improve throughput and CoO.

As described above, perpendicularity can be adjusted by the ratio of the $CHF_3$ gas with respect to the $Cl_2$ gas and the bias power, the wafer stage may be 100° C. or less. However, to consistently process the laminated films above and below the B-doped ACL film in one chamber to maintain high throughput, it is preferable to set the temperature to 0° C. or more and 60° C. or less.

Although the $CHF_3$ gas is used as a fluorine-containing gas in this embodiment, other $CH_2F_2$ gas, $CH_3F$ gas, $NF_3$ gas, $CF_4$ gas, $SF_6$ gas may be used. In addition to $Cl_2$ gas, HBr gas or HI gas of Br-containing gas may be used. In addition to $SiCl_4$ gas, $SiF_4$ gas may be used. For example, when $NF_3$ gas, $CF_4$ gas, $SF_6$ gas, and the like which generate a large amount of fluorine in comparison with the $CHF_3$ gas are used, a fluorine-based gas ratio is reduced in comparison with when $CHF_3$ gas is used, or the vertical shape can be maintained by lowering a set temperature of the sample stand 103.

Further, in the embodiment, a mixed gas of an oxygen gas, a fluorine-containing gas, a halogen gas, and a silicon tetrachloride gas, or a mixed gas of an oxygen gas, a fluorine-containing gas, a halogen gas, and a silicon tetrafluoride gas is used for plasma-etching an amorphous carbon film containing boron. However, even if the mixed gas of the oxygen gas, the fluorine-containing gas, the halogen gas and the silicon tetrachloride gas, or the mixed gas of the oxygen gas, the fluorine-containing gas, the halogen gas, and the silicon tetrafluoride gas is diluted with an inert gas of such as $N_2$ Gas, Ar gas, He gas, Xe gas, or Kr gas, the same effect as in the present embodiment can be obtained.

In addition, in the case where the HBr gas is used, reactivity is lower than that of the $Cl_2$ gas. Therefore, the HBr can be adjusted with a smaller flow rate than that of the $Cl_2$ gas. When the $SiF_4$ gas is used, since the gas is a precursor of an oxide film and also a source of fluorine element, a high selectivity can be realized by appropriately adjusting the flow rate while decreasing the amount of fluorine-based gas.

Further, in the embodiment, the mask formation example of the B-doped ACL film which is the boron-containing amorphous carbon film is described. However, even if the dry etching according to the present invention is applied to an amorphous carbon film not containing boron, the same effect as in the embodiment can be obtained. In other words, even if the dry etching according to the present invention is applied to a conventional amorphous carbon film, the same effect as in the embodiment can be obtained.

This is because the main component of the boron-free amorphous carbon film is the same organic material as the main component of the boron-containing amorphous carbon film, silicon oxide compounds are deposited on the silicon oxynitride film 203, which is a mask, by adding the silicon tetrachloride gas or the silicon tetrafluoride gas, and the etching amount of the silicon oxynitride film 203 is decreased to improve selectivity.

Further, to perform the dry etching method according to the present invention, an etching apparatus which has the above-described gas type, can apply a bias of about 3000 W, and enables consistent etching at a high pressure of 4 Pa or more. In the embodiment, the VHF etching apparatus having a parallel plate structure indicated in FIG. 1 is used. However, in a plasma etching apparatus using other plasma sources such as capasitively coupled plasma (CCP), inductively coupled plasma (ICP), and micro wave electron cyclotron resonance (μ wave ECR), by adjusting such as a pressure, a gas flow rate, a gas ratio, a bias power, a frequency, and a stage temperature, it is possible to obtain the same effect as in this embodiment.

As described above, according to the present invention, the amorphous carbon film can be etched at a high etching rate and with high selectivity by using an inorganic film as a mask. Therefore, it is possible to perform a consistent etching process including prior and post processes and realize high throughput including the prior and post processes by simplifying the mask film forming process.

REFERENCE SIGNS LIST 101 vacuum vessel
102 wafer
103 sample stand
104 first matching device
105 radio frequency power supply for bias application
106 DC power supply
107 temperature control unit
108 antenna
109 second matching unit
110 radio frequency power supply for plasma generation
111 solenoid coil
112 shower plate
113 inner gas supply channel
114 outer gas supply channel
115 main gas system
116 inner added gas system
117 outer added gas system
118 flow rate controller A
119 flow rate controller B
120 flow rate controller C
121a flow rate controller D
121b flow rate controller D
121c flow rate controller D
122a flow rate controller E
122b flow rate controller E
123 stop valve
124 gas flow divider
201 pair layer of silicon oxide film and polysilicon film
202 B-doped ACL film
203 silicon oxynitride film
204 anti-reflection film
205 photoresist film
301 side etch
302 bowing
303 etch stop
304 faceting

The invention claimed is:

1. A plasma processing method for forming a mask by plasma etching a laminated film having an amorphous carbon film containing boron, wherein the boron-containing amorphous carbon film is plasma-etched by using a mixed gas of an oxygen gas, a fluorine-containing gas, a halogen gas, and a silicon tetrafluoride gas, or a mixed gas of an oxygen gas, a fluorine-containing gas, a halogen gas, and a silicon tetrachloride gas.

2. The plasma processing method according to claim 1, wherein the fluorine-containing gas is $CHF_3$ gas, $CH_2F_2$ gas, $CH_3F$ gas, $NF_3$ gas, $CF_4$ gas, or $SF_6$ gas, and the halogen gas is $Cl_2$ gas, HBr gas, or HI gas.

3. The plasma processing method according to claim 1, wherein a flow rate ratio of the halogen gas with respect to the mixed gas is higher than a flow rate ratio of the fluorine-containing gas with respect to the mixed gas.

4. The plasma processing method according to claim 1, wherein the boron-containing amorphous carbon film is plasma-etched by supplying a radio frequency power of 1000 W or more to a sample stand on which a sample on which the laminated film is formed is placed or by applying a radio frequency peak-to-peak voltage of 1350 V or more to the sample stand.

5. The plasma processing method according to claim 1, wherein a pressure is set to 4 Pa or more to plasma-etch the boron-containing amorphous carbon film.

6. The plasma processing method according to claim 1, wherein the boron-containing amorphous carbon film is plasma-etched by using a mixed gas of $O_2$ gas, $CHF_3$ gas, $Cl_2$ gas, and $SiCl_4$ gas.

7. A plasma processing method for forming a mask by plasma-etching a laminated film including an amorphous carbon film, wherein the amorphous carbon film is plasma-etched by using a mixed gas of an oxygen gas, a fluorine-containing gas, a halogen gas, and a silicon tetrafluoride gas, or a mixed gas of an oxygen gas, a fluorine-containing gas, a halogen gas, and a silicon tetrachloride gas.

\* \* \* \* \*